(12) United States Patent
Bodnar et al.

(10) Patent No.: US 6,519,734 B1
(45) Date of Patent: Feb. 11, 2003

(54) SINGLE BIT ERROR CORRECTION, DOUBLE BURST ERROR DETECTION TECHNIQUE

(75) Inventors: Lance M. Bodnar, San Diego, CA (US); Gregory P. Chapelle, San Diego, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/572,817

(22) Filed: May 17, 2000

(51) Int. Cl.[7] ............................................. H03M 13/00
(52) U.S. Cl. ...................... 714/761; 714/762; 714/758; 714/793
(58) Field of Search ................. 714/761, 798, 714/776, 767, 764, 762, 758, 793

(56) References Cited

U.S. PATENT DOCUMENTS

| | | | |
|---|---|---|---|
| 4,345,328 A | 8/1982 | White ......................... 371/38 |
| 4,464,753 A | * 8/1984 | Chen ......................... 714/761 |
| 4,523,314 A | 6/1985 | Burns et al. ................... 371/38 |
| 4,713,816 A | * 12/1987 | Van Gils ..................... 714/761 |
| 4,718,067 A | * 1/1988 | Peters ........................ 714/761 |
| 4,821,270 A | * 4/1989 | Mauge ....................... 714/798 |
| 4,905,242 A | 2/1990 | Popp ......................... 371/40.1 |
| 5,315,544 A | 5/1994 | Yokote et al. ................ 365/154 |
| 5,457,702 A | 10/1995 | Williams et al. ............. 371/379 |
| 5,491,702 A | * 2/1996 | Kinsel ........................ 714/776 |
| 5,922,080 A | * 7/1999 | Olarig ........................ 714/767 |

OTHER PUBLICATIONS

Hsiao, "A Class of Optical Minimum Odd–weight–column SED–DED Codes," *IBM J. Res. Develop.*, 14, Jul. 1970, pp. 395–401.

Lin et al., *Error Control Coding: Fundamentals and Applications*, Chapter 16, "Applications of Block Codes for Error Control in Data Storage Systems," Prentice–Hall Inc., 1983.

* cited by examiner

*Primary Examiner*—David Ton
(74) *Attorney, Agent, or Firm*—Antonelli, Terry, Stout & Kraus, LLP

(57) ABSTRACT

An error correction and detection technique provides a correction code for correcting single bit errors as well as detecting but not correcting two adjacent bits in error. A received word, which may contain errors, is multiplied by a parity check matrix to produce a syndrome corresponding to one of first and second mutually exclusive sets of syndromes if the received word contains at least one error, each single bit error in the received bit word corresponding one-to-one with a member of the first of the sets of syndromes and each two bit adjacent error corresponding non-uniquely to a member of the second of the sets of syndromes. A syndrome containing all zeros is produced if the received word contains no errors. One bit data errors in the received word are corrected, two bit errors are reported, and no action is taken if the word contains no errors.

8 Claims, 2 Drawing Sheets

| COLUMN | 53 | | 51 | | | | 47 | | | | 43 | | | | 39 | | | 36 |
|---|---|---|---|---|---|---|---|---|---|---|---|---|---|---|---|---|---|---|
| HEX | 20 | 10 | 08 | 04 | 02 | 01 | 31 | 29 | 25 | 23 | 13 | 0B | 07 | 37 | 2F | 0E | 3E | 26 |
| BINARY | 1 | 0 | 0 | 0 | 0 | 0 | 1 | 1 | 1 | 1 | 0 | 0 | 0 | 1 | 1 | 0 | 1 | 1 |
| | 0 | 1 | 0 | 0 | 0 | 0 | 1 | 0 | 0 | 0 | 1 | 0 | 0 | 1 | 0 | 0 | 1 | 0 |
| | 0 | 0 | 1 | 0 | 0 | 0 | 0 | 1 | 0 | 0 | 0 | 1 | 0 | 1 | 1 | 1 | 1 | 0 |
| | 0 | 0 | 0 | 1 | 0 | 0 | 0 | 0 | 1 | 0 | 0 | 0 | 1 | 1 | 1 | 1 | 1 | 1 |
| | 0 | 0 | 0 | 0 | 1 | 0 | 0 | 0 | 0 | 1 | 1 | 1 | 1 | 1 | 1 | 1 | 1 | 1 |
| | 0 | 0 | 0 | 0 | 0 | 1 | 1 | 1 | 1 | 1 | 1 | 1 | 1 | 1 | 0 | 0 | 0 | 0 |
| COLUMN | 35 | | 33 | | | | 29 | | | | 25 | | | | 21 | | | 18 |
| HEX | 0A | 05 | 09 | 3B | 38 | 19 | 1F | 1C | 3D | 0D | 2C | 2A | 1A | 28 | 24 | 16 | 15 | 34 |
| BINARY | 0 | 0 | 0 | 1 | 1 | 0 | 0 | 0 | 1 | 0 | 1 | 1 | 0 | 1 | 1 | 0 | 0 | 1 |
| | 0 | 0 | 0 | 1 | 1 | 1 | 1 | 1 | 1 | 0 | 0 | 0 | 1 | 0 | 0 | 1 | 1 | 1 |
| | 1 | 0 | 1 | 1 | 1 | 1 | 1 | 1 | 1 | 1 | 1 | 1 | 1 | 1 | 0 | 0 | 0 | 0 |
| | 0 | 1 | 0 | 0 | 0 | 0 | 1 | 1 | 1 | 1 | 1 | 0 | 0 | 0 | 1 | 1 | 1 | 1 |
| | 1 | 0 | 0 | 1 | 0 | 0 | 1 | 0 | 0 | 0 | 0 | 1 | 1 | 0 | 0 | 1 | 0 | 0 |
| | 0 | 1 | 1 | 1 | 0 | 1 | 1 | 0 | 1 | 1 | 0 | 0 | 0 | 0 | 0 | 0 | 1 | 0 |
| COLUMN | 17 | | 15 | | | | 11 | | | | 7 | | | | 3 | | | 0 |
| HEX | 14 | 12 | 11 | 22 | 3A | 36 | 35 | 39 | 3F | 3C | 1D | 2E | 1E | 2D | 2B | 1B | 17 | 27 |
| BINARY | 0 | 0 | 0 | 1 | 1 | 1 | 1 | 1 | 1 | 1 | 0 | 1 | 0 | 1 | 1 | 0 | 0 | 1 |
| | 1 | 1 | 1 | 0 | 1 | 1 | 1 | 1 | 1 | 1 | 1 | 0 | 1 | 0 | 0 | 1 | 1 | 0 |
| | 0 | 0 | 0 | 0 | 1 | 0 | 0 | 1 | 1 | 1 | 1 | 1 | 1 | 1 | 1 | 0 | 0 | 0 |
| | 1 | 0 | 0 | 0 | 0 | 1 | 1 | 0 | 1 | 1 | 1 | 1 | 1 | 0 | 0 | 0 | 1 | 1 |
| | 0 | 1 | 0 | 1 | 1 | 1 | 0 | 0 | 1 | 0 | 0 | 1 | 1 | 0 | 1 | 1 | 1 | 1 |
| | 0 | 0 | 1 | 0 | 0 | 0 | 1 | 1 | 1 | 0 | 1 | 0 | 0 | 1 | 1 | 1 | 1 | 1 |

DUAL BURST ERROR SYNDROMES:     30   18   0C   06   03   21   33   32   0F

SINGLE BIT ERROR CORRECTION, DOUBLE BURST ERROR DETECTION TECHNIQUE

STATEMENT REGARDING FEDERALLY SPONSORED RESEARCH OR DEVELOPMENT

This invention was made with Government support under Contract No. F33657-91-C-0006. The Government has certain rights in this invention.

BACKGROUND OF THE INVENTION

1. Field of the Invention

The present invention relates to a single bit error correction, double burst error detection technique and more particularly to a single bit error correction, double burst error detection code which may be used with RAMs (Random Access Memories) which experience single and adjacent bit errors due to the impingement of high energy particles.

2. Description of Related Art

A microprocessor executing software from RAMs can experience single and adjacent bit errors from high energy particles. Previous attempts to alleviate these errors involve using error correction codes. However, these error correction codes substantially increase the number of bits which must be added to the base microprocessor word width. This both increases the amount of RAM memory needed as well as slowing the processing time due to the increased word length and increased processing time needed for error correction.

There have been many previous attempts to formulate error correction codes, particularly single bit error correcting-double bit error detecting codes. One such attempt is disclosed in an article entitled: "A Class of Optimal Minimum Odd-Weight-Column SEC-DED Codes," by M. Y. Hsaio, IBM J. Res. Dev., Jul. 14, 1970.

While the technique of Hsaio results in useful correction codes, the addition of the number of parity bits needed for error detection and correction by the Hsaio technique often results in too high an overhead, thereby rendering the technique of Hsaio unusable in certain applications.

U.S. Pat. No. 4,345,328 to White discloses an apparatus for and method of providing single bit error correction and double bit error detection using through checking parity bits. A coding scheme is implemented which uses through checking parity bits appended to each byte as check bits. The remaining check bits are generated such that the combination of through checking parity bits and remaining check bits together provide single bit error correction and double bit error detection. While the scheme of White is useful, it is considerably more complex in handling certain types of double bit errors than that of the present invention.

U.S. Pat. No. 4,905,242 to Popp discloses an error detection and correction apparatus utilizing seven internally generated check bits which are applied to incoming data signals on the next clock. The technique of Popp used a reduced set of check bits to only handle single bit errors in order to reduce the complexity of the technique and was able to pipeline the error checking activity. The present invention, on the other hand, is likewise of low complexity, yet adds double burst error detection.

U.S. Pat. No. 5,457,702 to Williams et al. discloses a system for correcting a single bit error and detecting burst errors. The technique of Williams et al. uses a complex set of error checking bits to increase the error checking performance to handle burst errors but at the high overhead due to the large number of check bits needed for the technique. On the other hand, the technique of the present invention takes a different approach so as to detect certain types of burst errors with less complexity and more efficiency.

U.S. Pat. No. 4,523,314, to Burns et al. discloses an improved error indicating system utilizing adder circuits for use with an error correction code system capable of detecting and indicating multiple bits errors and detecting and correcting single bit errors. As with the above-cited patents, Burns et al. system is more complex than that of the present invention.

SUMMARY OF THE INVENTION

The object of the present invention is to provide an error correction code that can correct the most likely error pattern namely, a single bit error, as well as detecting but not correcting the next most likely error pattern, namely, two adjacent bits in error, with fewer parity bits than any other presently used code.

In the present invention, errors are detected and corrected by the generation of specific syndromes for the error pattern. A systematic code is developed by constructing a parity check matrix which, when multiplied by a vector retrieved from a RAM and corrupted by errors, produces a product known as a syndrome which is a member of one of two mutually exclusive sets. Each possible single bit error corresponds one to one with a member of the first set of syndromes and each two bit adjacent error corresponds non-uniquely to a member of the second separate set of syndromes.

BRIEF DESCRIPTION OF THE DRAWINGS

The foregoing and a better understanding of the present invention will become apparent from the following detail description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

DETAILED DESCRIPTION OF THE INVENTION

Figures 1, 2:
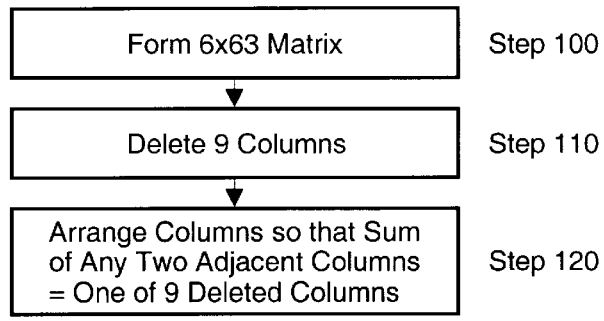
FIG. 1 is a flowchart of the steps of generating a parity check matrix.
FIG. 2 is a drawing of a parity check matrix for a single error correcting, double burst error detecting code.

Before beginning a detailed description of the subject invention, mention of the following is in order. When appropriate, like reference numerals and characters may be used to designate identical, corresponding, or similar components in differing drawing figures. Furthermore, in the detail description to follow, example sizes/models/values/ranges may be given, although the present invention is not limited thereto. In addition, well-known components and elements have been omitted from the drawing figures for simplicity of illustration and discussion and so as not to obscure the invention.

The present invention uses the available RAM parity bits, for example, to develop a systematic error correction code capable of single bit error correction and double burst error detection. In one example of the application of the present invention, instructions 48 bit wide may be stored in three 18 bit wide RAM chips for a total of 54 bits of storage per RAM address. This permits the use of the 54−48=6 remaining bits to provide error detection and correction. An (n, k)=(54, 48) linear code has been developed which will correct all single bit errors and detect all two bit burst errors in a 54 bit code word with the exception of the case where sequentially number bits are stored in physically separate RAM chips.

Note that the exception with regard to sequentially numbered bits stored in separate RAM chips is not significant in that the probability of occurrence of double burst errors occurring in two sequentially numbered bits stored in physically separate RAM chips is extremely low.

The code is constructed by constructing its parity check matrix H. The parity check matrix has dimensions of 6 rows by 54 columns. A row vector c of length 54 is a valid code word if and only if:

$$cH^T = 0_{1 \times 6},\qquad(1)$$

where $0_{1 \times 6}$ is a 1 by 6 row vector of zeros. $H^T$ is the H matrix transposed. That is, $H^T$ is the H matrix with the rows changed to columns, and the columns changed to rows.

A codeword c is generated from a 48 bit information vector i using a 48 row by 54 column generator matrix G that satisfies the following equations:

$$GH^T = 0_{48 \times 6} \qquad(2)$$

$$c = iG. \qquad(3)$$

If a code is systematic, that is, if all of the information bits appear unaltered and in the same order in the codeword, then G can easily be constructed from H. The requirement for G and the relationship between G and H when they describe a binary systematic code is as follows:

$$G = [P^T I_k] \qquad(4)$$

$$H = [I_{n-k} P] \qquad(5)$$

where P is an (n–k) by k matrix and in the present case, n is 54 and k is 48, and n–k is equal to 6.

If an error or errors occur in a stored codeword, the result is r=c+e, there the $i^{th}$ bit of e is 1 if an error has occurred in that bit and is a 0 if no error has occurred. All sums are performed modulo 2, which is equivalent to a bitwise XOR (exclusive-OR).

If one or more errors occur, e is not zero and the following is true:

$$rH^T = (c+e)H^T = cH^T + eH^T = 0_{1 \times 6} + s = s \qquad(6)$$

where the nonzero 1 by 6 row vector s is called the syndrome for the error pattern e.

Note that s depends only on e and not upon the codeword c. Also note that if the error pattern e happens to be a valid codeword, then $s = 0_{1 \times 6}$ and the error is undetected. If only one error occurs in a codeword, then only one bit position of e will contain a 1. If the $i^{th}$ bit position of e is one, $eH^T = s$ will be the $i^{th}$ column of H.

If e is a weight 2 error pattern, for example, if bits i and j are 1, then $eH^T = s$ will be the sum of columns i and j of H.

Each column of H can be viewed as a 6-bit number or as an element from $GF(2^6)$. Thus, there are $2^6 - 1 = 63$ possibilities for the 54 columns of H. The syndrome (000000) is excluded since it indicates no error in the codeword. As shown in FIG. 1, the following are the conditions for the parity check matrix H to describe a single error correcting double burst error detecting code for this example.

1. Start with a 6 by 63 matrix whose columns are all possible nonzero 6-bit numbers (Step 100).

2. Delete 9 columns. These will be the syndromes of 2-bit burst errors. The resulting matrix H is now a parity check matrix for a (54, 48) linear code (Step 110).

3. Each of the remaining 54 columns is unique, meaning that each single bit error pattern has a unique syndrome and it is possible to correct any single error by computing the syndrome of the received word. In addition, if the 54 columns are arranged so that the sum of any two adjacent columns is equal to one of the 9 columns (syndromes) deleted in step 2, then 2-bit adjacent error patterns can be detected, since they have different syndromes from those of the single error patterns (Step 120).

4. To create the systematic code described earlier, the first 6 columns of H must form a 6 by 6 identity matrix $I_6$. This implies that 5 of that columns deleted in step 2 must be (110000), (011000), (001100), (00110), and (000011).

The adjacent columns 36:35 and 18:17 are not required to sum to one of the 9 deleted syndromes. Again, this is because these consecutive locations are in different RAMs and are not prone to burst error as much as adjacent locations in the same RAM.

A code in accordance with the present invention successfully corrects all single bits errors and detects but does not correct all weight 2 burst errors occurring in the same RAM chip.

The parity check matrix H for the (54, 48) single error correcting double burst error detecting (SEC-DBED) code is illustrated in FIG. 2.

There are (54 choose 1)=54 distinct ways a single error can occur in a 54 bit long codeword, where (n choose k)=ni(ki(n–k)!). Similarly, there are (54 choose 2)=1431 distinct ways a double bit error can occur, 53 of which are double bit adjacent errors. By construction, the code will correct all single errors and detect all weight 2 adjacent errors, except those over bits 36:35 and 18:17. In addition, a MATLAB simulation has shown that it will detect 213 of the 1431 possible weight 2 errors in any position, or approximately 15%.

Since the first 6 columns of H form an identity matrix, the code is systematic. This means that if the computed syndrome of an instruction codeword is $0_{1 \times 6}$, then the received word r contains no errors and the decoded instruction is simply bits 47:0 of r.

Decoding is performed by first computing the syndrome of the received word r. If the syndrome is a column of H, then a single error has occurred (the maximum likelihood rule) and the bit of r corresponding to the column in H must be inverted to correct the received word r. The lowest 48-bits of r are stripped off and decoding is complete. If s is one of the remaining 9 syndromes, then a multiple weight error has been detected and decoding is not performed, but rather an uncorrectable error detection is noted.

Figure 3:
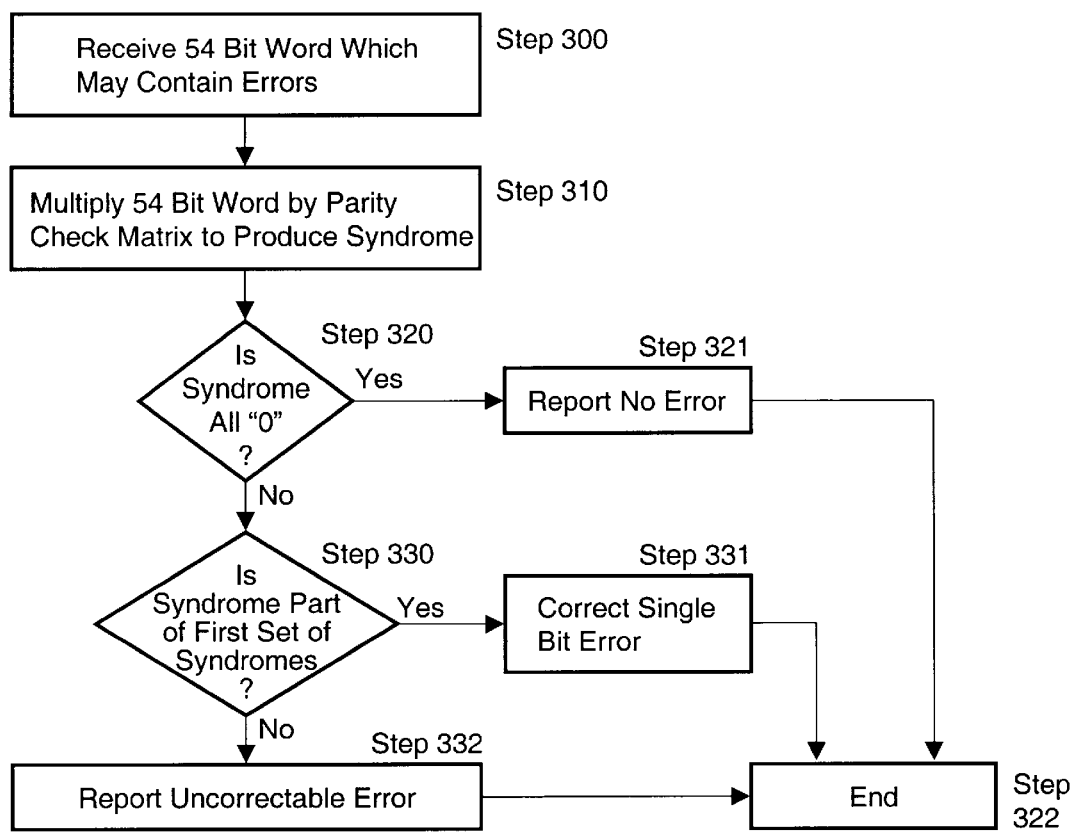
FIG. 3 is a flowchart of the steps of error detection and correction.

As illustrated in FIG. 3, the 54 bit word which may contain errors is received in step 300. In step 310, the 54 bit word is multiplied by the parity check matrix to produce a syndrome. In step 320, a determination is made as to whether the produced syndrome contains all "0"'s. If the produced syndrome contains all "0"'s, then a "no error" report is generated in step 321 and the process is ended in step 322. On the other hand, if the produced syndrome does not contain all "0"'s, then a determination is made in step 330 as to whether the produced syndrome is part of a first set of syndromes. If so, then the single bit error is corrected in step 331 and the process is ended in step 322. If not, then an "uncorrectable error" report is generated in step 332 and the process is ended in step 322.

This concludes the description of the example embodiments. Although the present invention has been described with reference to illustrative embodiments thereof, it should be as it stood that numerous other modifications and embodiments can be devised by those skilled in the art that fall within the spirit and scope of the principles of this invention. More particularly, reasonable variations and modifications are possible in the component parts and/or arrangements of the subject combination arrangement within the scope of the foregoing disclosure, the drawings, and the appended claims without departing from the spirit of the invention. In addition to variations and modifications in the component parts and/or arrangements, alternative uses will also be apparent to those skilled in the art.

What is claimed is:

1. A single bit error correction, double burst error detection method comprising:
    receiving a 54 bit word which may contain errors, said received 54 bit word including 48 data bits and 6 bits for error detection and correction;
    multiplying the received 54 bit word by a parity check matrix to produce a syndrome corresponding to one of two mutually exclusive sets of syndromes if the received 54 bit word contains at least one error, each single bit error in the received 54 bit word corresponding one-to-one with a member of a first of the two mutually exclusive sets of syndromes and each two bit adjacent error in the received 54 bit word corresponding non-uniquely to a member of the second of the two mutually exclusive sets of syndromes, and a syndrome containing all zeros if the received 54 bit word contains no errors;
    correcting the 48 data bits of the received 54 bit word by inverting a bit containing an error if the produced syndrome corresponds to one of the first of the two mutually exclusive sets of syndromes, the bit containing an error being determined by one of the first of the two mutually exclusive sets of syndromes;
    reporting an uncorrectable two bit adjacent error in the received 54 bit word if the produced syndrome corresponds to one of the second of the two mutually exclusive sets of syndromes; and
    reporting no error in the received 54 bit word if the produced syndrome contains all zeros.

2. The method of claim 1, the parity check matrix comprising:

| COLUMN | | | | | | | | | | | | | | | | | |
|---|---|---|---|---|---|---|---|---|---|---|---|---|---|---|---|---|---|
| 53 | | | 50 | | | | | 45 | | | | | 40 | | | | 36 |
| HEX 20 | 10 | 08 | 04 | 02 | 01 | 31 | 29 | 25 | 23 | 13 | 0B | 07 | 37 | 2F | 0E | 3E | 26 |
| BINARY 1 | 0 | 0 | 0 | 0 | 0 | 1 | 1 | 1 | 1 | 0 | 0 | 0 | 1 | 1 | 0 | 1 | 1 |
| 0 | 1 | 0 | 0 | 0 | 0 | 1 | 0 | 0 | 0 | 1 | 0 | 0 | 1 | 0 | 0 | 1 | 0 |
| 0 | 0 | 1 | 0 | 0 | 0 | 0 | 1 | 0 | 0 | 0 | 1 | 0 | 0 | 1 | 1 | 1 | 0 |
| 0 | 0 | 0 | 1 | 0 | 0 | 0 | 0 | 1 | 0 | 0 | 0 | 1 | 1 | 1 | 1 | 1 | 1 |
| 0 | 0 | 0 | 0 | 1 | 0 | 0 | 0 | 0 | 1 | 1 | 1 | 1 | 1 | 1 | 1 | 1 | 1 |
| 0 | 0 | 0 | 0 | 0 | 1 | 1 | 1 | 1 | 1 | 1 | 1 | 1 | 1 | 0 | 0 | 0 | 0 |

| COLUMN | | | | | | | | | | | | | | | | | |
|---|---|---|---|---|---|---|---|---|---|---|---|---|---|---|---|---|---|
| 35 | | | | 30 | | | | | 25 | | | | | 20 | | | 18 |
| HEX 0A | 05 | 09 | 3B | 38 | 19 | 1F | 1C | 3D | 0D | 2C | 2A | 1A | 28 | 24 | 16 | 15 | 34 |
| BINARY 0 | 0 | 0 | 1 | 1 | 0 | 0 | 0 | 1 | 0 | 1 | 1 | 0 | 1 | 1 | 0 | 0 | 1 |
| 0 | 0 | 0 | 1 | 1 | 1 | 1 | 1 | 1 | 0 | 0 | 0 | 1 | 0 | 0 | 1 | 1 | 1 |
| 1 | 0 | 1 | 1 | 1 | 1 | 1 | 1 | 1 | 1 | 1 | 1 | 1 | 0 | 0 | 0 | 0 | 0 |
| 0 | 1 | 0 | 0 | 0 | 0 | 1 | 1 | 1 | 1 | 1 | 0 | 0 | 0 | 1 | 1 | 1 | 1 |
| 1 | 0 | 0 | 1 | 0 | 0 | 1 | 0 | 0 | 0 | 0 | 1 | 1 | 0 | 0 | 1 | 0 | 0 |
| 0 | 1 | 1 | 1 | 0 | 1 | 1 | 0 | 1 | 1 | 0 | 0 | 0 | 0 | 0 | 0 | 1 | 0 |

| COLUMN | | | | | | | | | | | | | | | | | |
|---|---|---|---|---|---|---|---|---|---|---|---|---|---|---|---|---|---|
| 17 | | 15 | | | | | 10 | | | | | 5 | | | | | 0 |
| HEX 14 | 12 | 11 | 22 | 3A | 36 | 35 | 39 | 3F | 3C | 1D | 2E | 1E | 2D | 2B | 1B | 17 | 27 |
| BINARY 0 | 0 | 0 | 1 | 1 | 1 | 1 | 1 | 1 | 1 | 0 | 1 | 0 | 1 | 1 | 0 | 0 | 1 |
| 1 | 1 | 1 | 0 | 1 | 1 | 1 | 1 | 1 | 1 | 1 | 0 | 1 | 0 | 0 | 1 | 1 | 0 |
| 0 | 0 | 0 | 0 | 1 | 0 | 0 | 1 | 1 | 1 | 1 | 1 | 1 | 1 | 1 | 0 | 0 | 0 |
| 1 | 0 | 0 | 0 | 0 | 1 | 1 | 0 | 1 | 1 | 1 | 1 | 1 | 0 | 0 | 1 | 1 | 1 |
| 0 | 1 | 0 | 1 | 1 | 1 | 0 | 0 | 1 | 0 | 0 | 1 | 1 | 0 | 1 | 1 | 1 | 1 |
| 0 | 0 | 1 | 0 | 0 | 0 | 1 | 1 | 1 | 0 | 1 | 0 | 0 | 1 | 1 | 1 | 1 | 1 |

DUAL BURST ERROR SYNDROMES: 30  18  0C  06  03  21  33  32  0F

3. An apparatus for performing single bit error correction and double burst error detection, the apparatus comprising:
    a receiver for receiving a 54 bit word which may contain errors, said received 54 bit word including 48 data bits and 6 bits for error detection and correction;
    a multiplier for multiplying the received 54 bit word by a parity check matrix to produce a syndrome corresponding to one of two mutually exclusive sets of syndromes if the received 54 bit word contains at least one error, each single bit error in the received 54 bit word corresponding one-to-one with a member of a first of the two mutually exclusive sets of syndromes and each two bit adjacent error in the received 54 bit word corresponding non-uniquely to a member of the second of the two mutually exclusive sets of syndromes, and a syndrome containing all zeros if the received 54 bit word contains no errors;
    a code corrector for correcting the 48 data bits of the received 54 bit word by inverting a bit containing an error if the produced syndrome corresponds to one of the first of the two mutually exclusive sets of syndromes, the bit containing the error being determined by one of the first of the two mutually exclusive sets of syndromes;
    the code corrector reporting an uncorrectable two bit adjacent error in the received 54 bit word if the produced syndrome corresponds to one of the second of the two mutually exclusive sets of syndromes; and the code corrector reporting no error in the received 54 bit word if the produced syndrome contains all zeros.

4. The apparatus of claim 3, wherein the parity check matrix comprises:

arranging the 54 columns of the resulting matrix so that any two adjacent columns sum to one of the 9 deleted columns which form syndromes for two bit burst errors except for adjacent columns 36:35 and 18:17.

| | | COLUMN | | | | | | | | | | | | | | | | |
|---|---|---|---|---|---|---|---|---|---|---|---|---|---|---|---|---|---|---|
| | 53 | | | 50 | | | | | 45 | | | | | 40 | | | | 36 |
| HEX | 20 | 10 | 08 | 04 | 02 | 01 | 31 | 29 | 25 | 23 | 13 | 0B | 07 | 37 | 2F | 0E | 3E | 26 |
| BINARY | 1 | 0 | 0 | 0 | 0 | 0 | 1 | 1 | 1 | 1 | 0 | 0 | 0 | 1 | 1 | 0 | 1 | 1 |
| | 0 | 1 | 0 | 0 | 0 | 0 | 1 | 0 | 0 | 0 | 1 | 0 | 0 | 1 | 0 | 1 | 1 | 0 |
| | 0 | 0 | 1 | 0 | 0 | 0 | 0 | 1 | 0 | 0 | 0 | 1 | 0 | 0 | 1 | 1 | 1 | 0 |
| | 0 | 0 | 0 | 1 | 0 | 0 | 0 | 0 | 1 | 0 | 0 | 0 | *i | 1 | 1 | 1 | 1 | 1 |
| | 0 | 0 | 0 | 0 | 1 | 0 | 0 | 0 | 0 | 1 | 1 | 1 | 1 | 1 | 1 | 1 | 1 | 1 |
| | 0 | 0 | 0 | 0 | 0 | 1 | 1 | 1 | 1 | 1 | 1 | 1 | 1 | 1 | 1 | 0 | 0 | 0 |

| | | COLUMN | | | | | | | | | | | | | | | | |
|---|---|---|---|---|---|---|---|---|---|---|---|---|---|---|---|---|---|---|
| | 35 | | | | 30 | | | | | 25 | | | | | 20 | | | 18 |
| HEX | 0A | 05 | 09 | 3B | 38 | 19 | 1F | 1C | 3D | 0D | 2C | 2A | 1A | 28 | 24 | 16 | 15 | 34 |
| BINARY | 0 | 0 | 0 | 1 | 1 | 0 | 0 | 0 | 1 | 0 | 1 | 1 | 0 | 1 | 1 | 0 | 0 | 1 |
| | 0 | 0 | 0 | 1 | 1 | 1 | 1 | 1 | 1 | 0 | 0 | 0 | 1 | 0 | 0 | 1 | 1 | 1 |
| | 1 | 0 | 1 | 1 | 1 | 1 | 1 | 1 | 1 | 1 | 1 | 1 | 1 | 0 | 0 | 0 | 0 | 0 |
| | 0 | 1 | 0 | 0 | 0 | 0 | 1 | 1 | 1 | 1 | 1 | 0 | 0 | 0 | 1 | 1 | 1 | 1 |
| | 1 | 0 | 0 | 1 | 0 | 0 | 1 | 0 | 0 | 0 | 0 | 1 | 1 | 0 | 0 | 1 | 0 | 0 |
| | 0 | 1 | 1 | 1 | 0 | 1 | 1 | 0 | 1 | 1 | 0 | 0 | 0 | 0 | 0 | 0 | 1 | 0 |

| | | COLUMN | | | | | | | | | | | | | | | | |
|---|---|---|---|---|---|---|---|---|---|---|---|---|---|---|---|---|---|---|
| | 17 | | 15 | | | | 10 | | | | | 5 | | | | | | 0 |
| HEX | 14 | 12 | 11 | 22 | 3A | 36 | 35 | 39 | 3F | 3C | 1D | 2E | 1E | 2D | 2B | 1B | 17 | 27 |
| BINARY | 0 | 0 | 0 | 1 | 1 | 1 | 1 | 1 | 1 | 1 | 0 | 1 | 0 | 1 | 1 | 0 | 0 | 1 |
| | 1 | 1 | 1 | 0 | 1 | 1 | 1 | 1 | 1 | 1 | 1 | 0 | 1 | 0 | 0 | 1 | 1 | 0 |
| | 0 | 0 | 0 | 0 | 1 | 0 | 0 | 1 | 1 | 1 | 1 | 1 | 1 | 1 | 1 | 0 | 0 | 0 |
| | 1 | 0 | 0 | 0 | 0 | 1 | 1 | 0 | 1 | 1 | 1 | 1 | 1 | 1 | 0 | 0 | 1 | 1 |
| | 0 | 1 | 0 | 1 | 1 | 1 | 0 | 0 | 1 | 0 | 0 | 1 | 1 | 0 | 1 | 1 | 1 | 1 |
| | 0 | 0 | 1 | 0 | 0 | 0 | 1 | 1 | 1 | 0 | 1 | 0 | 0 | 1 | 1 | 1 | 1 | 1 |

DUAL BURST ERROR SYNDROMES: 30  18  0C  06  03  21  33  32  0F

5. A method of generating a parity check matrix for use in a single bit error correction, double burst error detection technique for a 54 bit word consisting of 48 data bits and 6 bits for error detection and correction, the method comprising:

forming a 6 by 63 matrix whose columns are all possible nonzero six bit numbers;

deleting 9 columns of the matrix which form syndromes for two bit burst errors, the resulting matrix forming a parity check matrix for a (54,48) linear code;

6. The method of claim 5, further comprising forming the first six columns of the resulting matrix into a 6 by 6 identity matrix and choosing 5 of the 9 deleted columns to be (110000), (011000), (001100), (000110) and (000011).

7. The method of claim 5, the parity check matrix comprising:

| | | COLUMN | | | | | | | | | | | | | | | | |
|---|---|---|---|---|---|---|---|---|---|---|---|---|---|---|---|---|---|---|
| | 53 | | | 50 | | | | | 45 | | | | | 40 | | | | 36 |
| HEX | 20 | 10 | 08 | 04 | 02 | 01 | 31 | 29 | 25 | 23 | 13 | 0B | 07 | 37 | 2F | 0E | 3E | 26 |
| BINARY | 1 | 0 | 0 | 0 | 0 | 0 | 1 | 1 | 1 | 1 | 0 | 0 | 0 | 1 | 1 | 0 | 1 | 1 |
| | 0 | 1 | 0 | 0 | 0 | 0 | 1 | 0 | 0 | 0 | 1 | 0 | 0 | 1 | 0 | 1 | 1 | 0 |
| | 0 | 0 | 1 | 0 | 0 | 0 | 0 | 1 | 0 | 0 | 0 | 1 | 0 | 0 | 1 | 1 | 1 | 0 |
| | 0 | 0 | 0 | 1 | 0 | 0 | 0 | 0 | 1 | 0 | 0 | 0 | 1 | 1 | 1 | 1 | 1 | 1 |
| | 0 | 0 | 0 | 0 | 1 | 0 | 0 | 0 | 0 | 1 | 1 | 1 | 1 | 1 | 1 | 1 | 1 | 1 |
| | 0 | 0 | 0 | 0 | 0 | 1 | 1 | 1 | 1 | 1 | 1 | 1 | 1 | 1 | 1 | 0 | 0 | 0 |

| | | COLUMN | | | | | | | | | | | | | | | | |
|---|---|---|---|---|---|---|---|---|---|---|---|---|---|---|---|---|---|---|
| | 35 | | | | 30 | | | | | 25 | | | | | 20 | | | 18 |
| HEX | 0A | 05 | 09 | 3B | 38 | 19 | 1F | 1C | 3D | 0D | 2C | 2A | 1A | 28 | 24 | 16 | 15 | 34 |

-continued

| BINARY | 0 | 0 | 0 | 1 | 1 | 0 | 0 | 0 | 1 | 0 | 1 | 1 | 0 | 1 | 1 | 0 | 0 | 1 |
|---|---|---|---|---|---|---|---|---|---|---|---|---|---|---|---|---|---|---|
|  | 0 | 0 | 0 | 1 | 1 | 1 | 1 | 1 | 1 | 0 | 0 | 0 | 1 | 0 | 0 | 1 | 1 | 1 |
|  | 1 | 0 | 1 | 1 | 1 | 1 | 1 | 1 | 1 | 1 | 1 | 1 | 1 | 0 | 0 | 0 | 0 | 0 |
|  | 0 | 1 | 0 | 0 | 0 | 0 | 1 | 1 | 1 | 1 | 1 | 0 | 0 | 0 | 1 | 1 | 1 | 1 |
|  | 1 | 0 | 0 | 1 | 0 | 0 | 1 | 0 | 0 | 0 | 0 | 1 | 1 | 0 | 0 | 1 | 0 | 0 |
|  | 0 | 1 | 1 | 1 | 0 | 1 | 1 | 0 | 1 | 1 | 0 | 0 | 0 | 0 | 0 | 0 | 1 | 0 |

| | | | | | | | | COLUMN | | | | | | | | | | |
|---|---|---|---|---|---|---|---|---|---|---|---|---|---|---|---|---|---|---|
| | 17 | | 15 | | | | | 10 | | | | | 5 | | | | | 0 |
| HEX | 14 | 12 | 11 | 22 | 3A | 36 | 35 | 39 | 3F | 3C | 1D | 2E | 1E | 2D | 2B | 1B | 17 | 27 |

| BINARY | 0 | 0 | 0 | 1 | 1 | 1 | 1 | 1 | 1 | 0 | 1 | 0 | 1 | 1 | 0 | 0 | 1 |
|---|---|---|---|---|---|---|---|---|---|---|---|---|---|---|---|---|---|---|
|  | 1 | 1 | 1 | 0 | 1 | 1 | 1 | 1 | 1 | 1 | 1 | 0 | 1 | 0 | 0 | 1 | 1 | 0 |
|  | 0 | 0 | 0 | 0 | 1 | 0 | 0 | 1 | 1 | 1 | 1 | 1 | 1 | 1 | 1 | 1 | 0 | 0 |
|  | 1 | 0 | 0 | 0 | 0 | 1 | 1 | 0 | 1 | 1 | 1 | 1 | 1 | 1 | 0 | 0 | 1 | 1 |
|  | 0 | 1 | 0 | 1 | 1 | 1 | 0 | 0 | 1 | 0 | 0 | 1 | 1 | 0 | 1 | 1 | 1 | 1 |
|  | 0 | 0 | 1 | 0 | 0 | 0 | 1 | 1 | 1 | 0 | 1 | 0 | 0 | 1 | 1 | 1 | 1 | 1 |

DUAL BURST ERROR SYNDROMES: 30  18  0C  06  03  21  33  32  0F  20

8. The method of claim 7, the parity check matrix comprising:

| | | | | | | | | COLUMN | | | | | | | | | |
|---|---|---|---|---|---|---|---|---|---|---|---|---|---|---|---|---|---|
| | 53 | | | 50 | | | | | 45 | | | | 40 | | | | 36 |
| HEX | 20 | 10 | 08 | 04 | 02 | 01 | 31 | 29 | 25 | 23 | 13 | 0B | 07 | 37 | 2F | 0E | 3E | 26 |

| BINARY | 1 | 0 | 0 | 0 | 0 | 0 | 1 | 1 | 1 | 1 | 0 | 0 | 0 | 1 | 1 | 0 | 1 | 1 |
|---|---|---|---|---|---|---|---|---|---|---|---|---|---|---|---|---|---|---|
|  | 0 | 1 | 0 | 0 | 0 | 0 | 1 | 0 | 0 | 0 | 1 | 0 | 0 | 1 | 0 | 0 | 1 | 0 |
|  | 0 | 0 | 1 | 0 | 0 | 0 | 0 | 1 | 0 | 0 | 0 | 1 | 0 | 0 | 1 | 1 | 1 | 0 |
|  | 0 | 0 | 0 | 1 | 0 | 0 | 0 | 0 | 1 | 0 | 0 | 0 | 1 | 1 | 1 | 1 | 1 | 1 |
|  | 0 | 0 | 0 | 0 | 1 | 0 | 0 | 0 | 0 | 1 | 1 | 1 | 1 | 1 | 1 | 1 | 1 | 1 |
|  | 0 | 0 | 0 | 0 | 0 | 1 | 1 | 1 | 1 | 1 | 1 | 1 | 1 | 1 | 0 | 0 | 0 | 0 |

| | | | | | | | | COLUMN | | | | | | | | | |
|---|---|---|---|---|---|---|---|---|---|---|---|---|---|---|---|---|---|
| | 35 | | | | | 30 | | | | 25 | | | | | 20 | | | 18 |
| HEX | 0A | 05 | 09 | 3B | 38 | 19 | 1F | 1C | 3D | 0D | 2C | 2A | 1A | 28 | 24 | 16 | 15 | 34 |

| BINARY | 0 | 0 | 0 | 1 | 1 | 0 | 0 | 0 | 1 | 0 | 1 | 1 | 0 | 1 | 1 | 0 | 0 | 1 |
|---|---|---|---|---|---|---|---|---|---|---|---|---|---|---|---|---|---|---|
|  | 0 | 0 | 0 | 1 | 1 | 1 | 1 | 1 | 1 | 0 | 0 | 0 | 1 | 0 | 0 | 1 | 1 | 1 |
|  | 1 | 0 | 1 | 1 | 1 | 1 | 1 | 1 | 1 | 1 | 1 | 1 | 1 | 0 | 0 | 0 | 0 | 0 |
|  | 0 | 1 | 0 | 0 | 0 | 0 | 1 | 1 | 1 | 1 | 1 | 0 | 0 | 0 | 1 | 1 | 1 | 1 |
|  | 1 | 0 | 0 | 1 | 0 | 0 | 1 | 0 | 0 | 0 | 0 | 1 | 1 | 0 | 0 | 1 | 0 | 0 |
|  | 0 | 1 | 1 | 1 | 0 | 1 | 1 | 0 | 1 | 1 | 0 | 0 | 0 | 0 | 0 | 0 | 1 | 0 |

| | | | | | | | | COLUMN | | | | | | | | | | |
|---|---|---|---|---|---|---|---|---|---|---|---|---|---|---|---|---|---|---|
| | 17 | | 15 | | | | | 10 | | | | | 5 | | | | | 0 |
| HEX | 14 | 12 | 11 | 22 | 3A | 36 | 35 | 39 | 3F | 3C | 1D | 2E | 1E | 2D | 2B | 1B | 17 | 27 |

| BINARY | 0 | 0 | 0 | 1 | 1 | 1 | 1 | 1 | 1 | 0 | 1 | 0 | 1 | 1 | 0 | 0 | 1 |
|---|---|---|---|---|---|---|---|---|---|---|---|---|---|---|---|---|---|---|
|  | 1 | 1 | 1 | 0 | 1 | 1 | 1 | 1 | 1 | 1 | 1 | 0 | 1 | 0 | 0 | 1 | 1 | 0 |
|  | 0 | 0 | 0 | 0 | 1 | 0 | 0 | 1 | 1 | 1 | 1 | 1 | 1 | 1 | 1 | 1 | 0 | 0 |
|  | 1 | 0 | 0 | 0 | 0 | 1 | 1 | 0 | 1 | 1 | 1 | 1 | 1 | 1 | 0 | 0 | 1 | 1 |
|  | 0 | 1 | 0 | 1 | 1 | 1 | 0 | 0 | 1 | 0 | 0 | 1 | 1 | 0 | 1 | 1 | 1 | 1 |
|  | 0 | 0 | 1 | 0 | 0 | 0 | 1 | 1 | 1 | 0 | 1 | 0 | 0 | 1 | 1 | 1 | 1 | 1 |

DUAL BURST ERROR SYNDROMES: 30  18  0C  06  03  21  33  32  0F

* * * * *